(12) United States Patent
Sim et al.

(10) Patent No.: US 6,546,511 B1
(45) Date of Patent: *Apr. 8, 2003

(54) APPARATUS AND METHOD FOR PARALLEL TESTING OF MULTIPLE FUNCTIONAL BLOCKS OF AN INTEGRATED CIRCUIT

(75) Inventors: Gyoo-chan Sim, Yongin (KR); Eun-seok Chae, Seoul (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/478,162

(22) Filed: Jan. 5, 2000

(30) Foreign Application Priority Data

Jun. 15, 1999 (KR) ............................................. 99-22310

(51) Int. Cl.⁷ .......................... G01R 31/28; G11C 29/00
(52) U.S. Cl. ........................................ 714/724; 714/718
(58) Field of Search ................................ 714/724, 726, 714/732–737, 718

(56) References Cited

U.S. PATENT DOCUMENTS

| | | | | |
|---|---|---|---|---|
| 3,614,608 A | * | 10/1971 | Giedd et al. ................. | 324/133 |
| 3,636,443 A | * | 1/1972 | Singh et al. ................. | 714/736 |
| 4,801,870 A | * | 1/1989 | Eichelberger et al. ...... | 714/732 |
| 5,422,892 A | * | 6/1995 | Hii et al. ..................... | 714/719 |
| 5,604,756 A | * | 2/1997 | Kawata ....................... | 714/718 |
| 5,701,309 A | * | 12/1997 | Gearhardt et al. ........... | 714/736 |
| 5,809,040 A | * | 9/1998 | Dallmann et al. ........... | 365/201 |
| 5,905,744 A | * | 5/1999 | Reise et al. .................. | 370/248 |
| 6,055,661 A | * | 4/2000 | Luk ............................. | 714/736 |

FOREIGN PATENT DOCUMENTS

| | | | | |
|---|---|---|---|---|
| JP | 63/005276 | 1/1988 | ........... | G01R/31/26 |
| JP | 63191080 | 8/1988 | ........... | G01R/31/28 |
| JP | 8136614 | 5/1996 | ........... | G01R/31/28 |
| JP | 08/184645 | 7/1996 | ........... | G01R/31/28 |

OTHER PUBLICATIONS

Digital System Testing and Testable Design: Chapter 9.2, Ad HOC Design for Testability pp. 347–351.
Digital System Testing and Testable Design: Chapter 10.6. Signature Analysis pp. 445–447.

* cited by examiner

*Primary Examiner*—Albert Decady
*Assistant Examiner*—Cynthia Britt
(74) *Attorney, Agent, or Firm*—Mills & Onello, LLP

(57) ABSTRACT

Functional blocks of an integrated circuit are tested in real time using a restricted number of output pins. The apparatus of the invention comprises an integrated circuit including a plurality of functional blocks, each of which, in response to a given stimulus, generates a similar output. The apparatus includes: a comparator for comparing the levels of like output signals from each of the functional blocks and for outputting the comparison result; a transmitter for external transmission of one of the output signals in response to the comparison result; and a failure discriminator for comparing the transmitted output signal level to a predetermined target output signal level, and if similar, transmitting a positive test result signal.

19 Claims, 4 Drawing Sheets

APPARATUS AND METHOD FOR PARALLEL TESTING OF MULTIPLE FUNCTIONAL BLOCKS OF AN INTEGRATED CIRCUIT

BACKGROUND OF THE INVENTION

1. Field of the Invention

The present invention relates to testing of an integrated circuit, or "chip", and more particularly, to an apparatus and method for parallel testing of a plurality of functional blocks of a single chip, each of which generates the same output signal for a given common input signal.

2. Description of the Related Art

As system-on-a-chip (SOC) design becomes increasingly widespread, it is more common to place a plurality of redundant cores, or functional blocks, on a single chip. In such circuits, a plurality of digital cores each having the same function, a plurality of memory cores each of the same size, or a plurality of analog cores may coexist on the same integrated circuit.

During testing of such circuits, it is determined whether each of the resident redundant functional blocks generates the same output for a given input provided to all blocks. In order to simultaneously test the functional blocks, an external test stimulus is provided to each functional block input, and the resulting response is sensed at each functional block output. Test stimulus can be simultaneously provided to all functional blocks via a single input pin and distributed, or "fanned-out" to each functional block. However, an output pin for each individual functional block is required to simultaneously transfer the test response of each functional block external to the chip. Increasing the output pin count for testing purposes is highly undesirable in circuit design practice.

For reducing the total number of output pins, a pin sharing technique and a multiple input signature register (MISR) technique have been suggested.

In the conventional pin sharing technique, the several outputs of the functional blocks are provided to a multiplexer which selectively transfers one among the functional block outputs to the test output pin. Thus, the number of test output pins can be reduced. However, this technique does not allow for the functional blocks to be tested in parallel, i.e., tested at the same time. In view of this, chip testing according to this technique is time consuming, and further, chip verification cannot be performed under real-time conditions.

Further, according to the conventional MISR method, the number of output pins can be reduced; however, a defective part response can be misrecognized as a non-defective response, leading to inaccurate test results.

SUMMARY OF THE INVENTION

It is an object of the present invention to provide an apparatus for the parallel testing of a plurality of functional blocks residing on a single chip, each of which generates a similar output for a given input, in real time, using only a restricted number of output pins.

It is another object of the present invention to provide a method for the parallel testing of a plurality of functional blocks residing on a single chip.

To achieve the first object of the present invention, there is provided an apparatus for the parallel testing of an integrated circuit, the integrated circuit including a plurality of functional blocks, each of which, in response to a common stimulus, generates like output signals. The apparatus comprises a comparator, a transmitter, and a failure discriminator. The comparator compares the levels of the output signals from each of the functional blocks, and outputs a comparison result. A transmitter externally transmits one of the output signals in response to the comparison result. A failure discriminator compares the transmitted output signal level to a predetermined target output signal level, and if similar, transmits a positive test result signal.

The failure discriminator preferably further transmits a negative test result signal when the transmitted output signal level and target output signal level are different. The transmitter preferably transmits one of the output signals when the comparator determines the output signal levels to be the same and transmits a defect signal when the comparator determines the output signal levels to be different.

The functional blocks may comprise circuit types consisting of analog circuits, digital circuits, and memory banks. Each of the functional blocks may digitally process the stimulus to each generate an N-bit output signal. In this case, the signal output to the comparator from each functional block comprises an arbitrary signal bit of the N-bit output signal. The comparator may comprise N-comparators, each for comparing the levels of like bits of the output signals.

To achieve the second object of the present invention, there is provided a method for the parallel testing of an integrated circuit, the integrated circuit including a plurality of functional blocks, each of which, in response to a common stimulus, generates like output signals. It is first determined whether the levels of the output signals from each of the functional blocks are the same. If the output signals are the same, one of the output signals is transmitted external to the integrated circuit. If the output signals are not all the same, none of the output signals are transmitted external to the integrated circuit. Next, it is determined whether the level of transmitted output signal is the same as a predetermined target output signal level. If the level of the output signal is substantially the same as the target level, the integrated circuit is deemed non-defective; otherwise, if all output signals are not the same, or if the level of the transmitted output signal is not the same as the target level, the integrated circuit is deemed defective.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
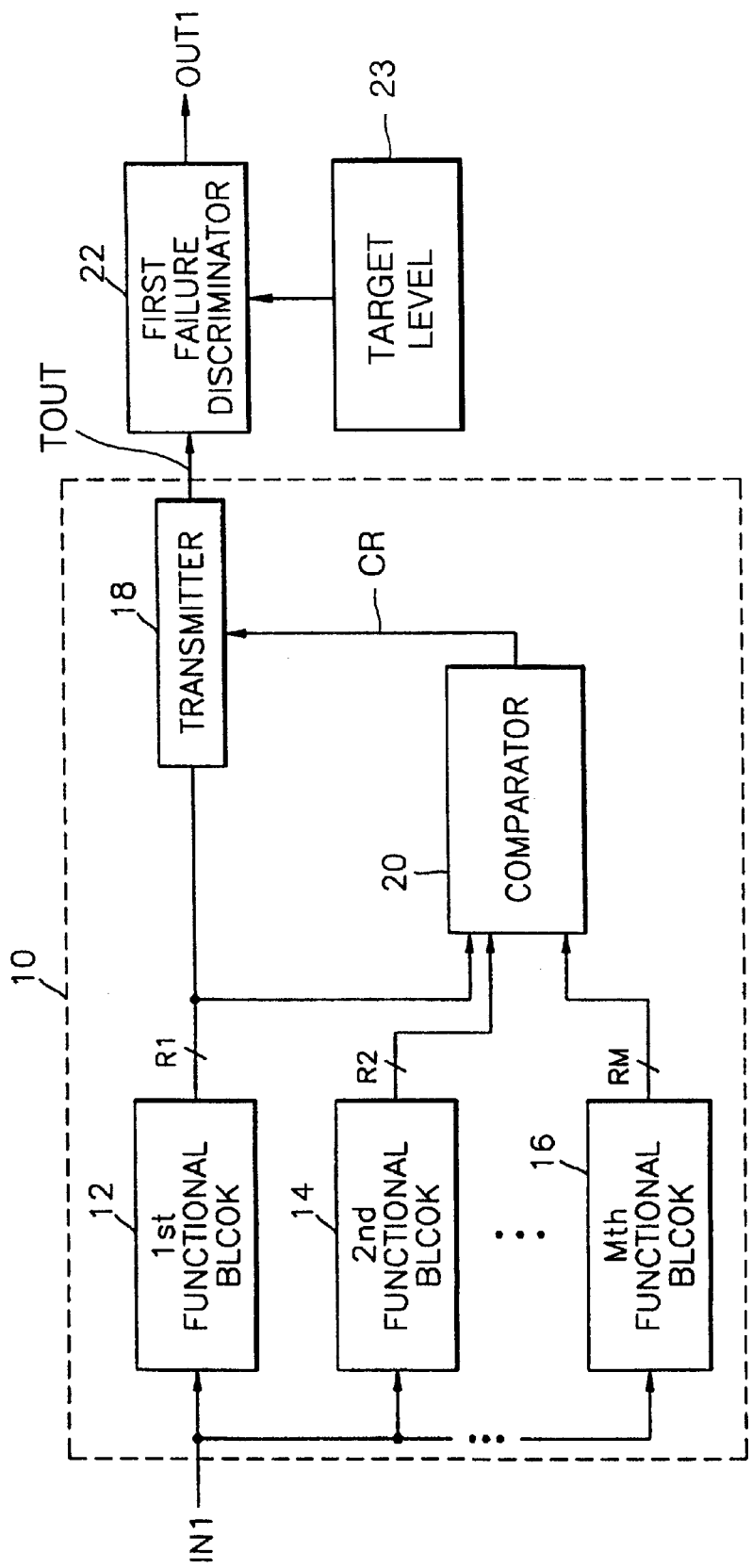
FIG. 1 is a block diagram illustrating an apparatus for the parallel testing of a single chip according to an embodiment of the present invention.

In FIG. 1, an apparatus for the parallel testing of a single chip (hereinafter referred to as a single chip parallel testing apparatus) according to an embodiment of the present invention comprises a single chip 10 including $1^{st}$, $2^{nd}$, ... and $M^{th}$ functional blocks 12, 14, ... and 16, a comparator 20, a transmitter 18, and a first failure discriminator 22.

Figure 2:
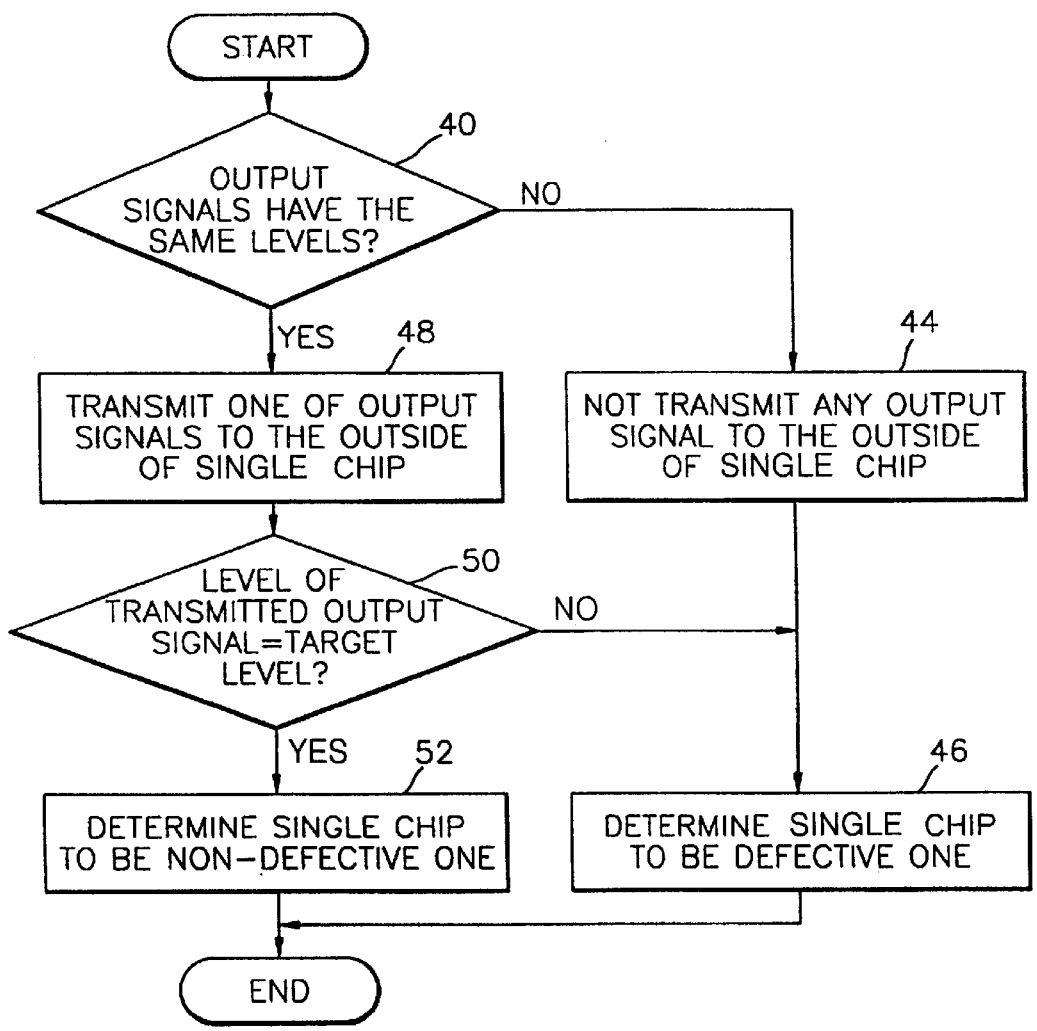
FIG. 2 is a flowchart illustrating a method for the parallel testing of a single chip according to the present invention, which is performed in the apparatus of FIG. 1.

FIG. 2 is a flowchart illustrating a method for the parallel testing of functional blocks located on a single chip (hereinafter referred to as a single chip parallel testing method), according to the present invention, performed by the apparatus of FIG. 1.

According to the method of FIG. 2, the steps of which are referred to hereinafter throughout the description of FIG. 1, a determination is made as to whether the single chip is defective by deciding whether the levels of output signals of the functional blocks are equal or not, and by comparing the level of at least one of the output signals to a target level (steps 40 through 52).

Returning to FIG. 1, in order to apply the single chip parallel testing apparatus and method according to the present invention, the $1^{st}$, $2^{nd}$, ... and $M^{th}$ functional blocks 12, 14, ... and 16 installed in the single chip 10 generate similar output signals R1, R2, ... and RM, for a given input stimulus received via input port IN1. The functional blocks do not necessarily need to perform the same function; instead, the functional blocks all generate the same output in response to a common input stimulus.

The comparator 20 determines whether the levels of each of the output signals R1, R2, ... and RM from the $1^{st}$, $2^{nd}$, ... and $M^{th}$ functional blocks 12, 14, ... and 16 are the same (step 40). If any are different, none of the output signals are externally transmitted (step 44) and the chip is deemed defective (step 46). In this mode, the transmitter 18 receives an arbitrary one of the output signals R1, R2, ... and RM from the $1^{st}$, $2^{nd}$, ... and $M^{th}$ functional blocks 12, 14, ... and 16, and outputs the received signal as output signal TOUT to the first failure discriminator 22 in response to the comparison result of the comparator 20. In this case, since the caparator result is negative, the arbitrary output signal is not transmitted as output signal TOUT. As an example, as shown in FIG. 1, the transmitter 18 may receive the output signal R1 of the $1^{st}$ functional block 12, and output the received signal R1 as output signal TOUT in response to the comparison result CR of the comparator 20. As an a preferred embodiment, the first failure discriminator 22 is located external to the chip 10.

Meanwhile, in the case where the levels of each of the output signals R1, R2, ... and RM from the $1^{st}$, $2^{nd}$, ... and $M^{th}$ functional blocks 12, 14, ... and 16 are the same, the transmitter 18 is controlled to transmit one of the output signals R1, R2, ... and RM to the first failure discriminator 22 located external to the single chip 10 under test (step 48).

Following step 48, the first failure discriminator 22 determines whether the level of the output signal TOUT received from the transmitter 18 of the single chip 10, is the same as a predetermined target level 23 (step 50). When the level of the output signal TOUT received from the transmitter 18 is within a tolerable range of the target level, the first failure discriminator 22 determines that the single chip 10 is valid, or non-defective, and outputs a good/failure indication signal indicating that the single chip is non-defective, via an output port OUT1 (step 52).

Following a determination that the level of the output signal from the transmitter 18 is not the same as the target level (step 50), the first failure discriminator 22 determines that the single chip 10 is defective, and outputs a good/failure indication signal indicating that the single chip is defective via the output port OUT1 (step 46).

In this manner, the present invention determines whether all functional blocks are generating the same outputs in response to the same stimuli; if not, this means that at least one of the functional blocks is malfunctioning. Further, even if the outputs from all functional blocks are at the same level, the level of one of the output signals is compared to the target level in order to verify that all blocks are not malfunctioning.

Each functional block of the apparatus in FIG. 1 may comprise an analog device, or a digital device, providing output signals R1, R2, ... and RM. In the case of a digital device, each output signal R1, R2 ... RM may comprise a single or multiple bits. In the multiple-bit case, for example, N bits ($N \geq 2$), the single chip parallel testing apparatus of FIG. 1 can be modified as shown in FIG. 3.

Figure 3:
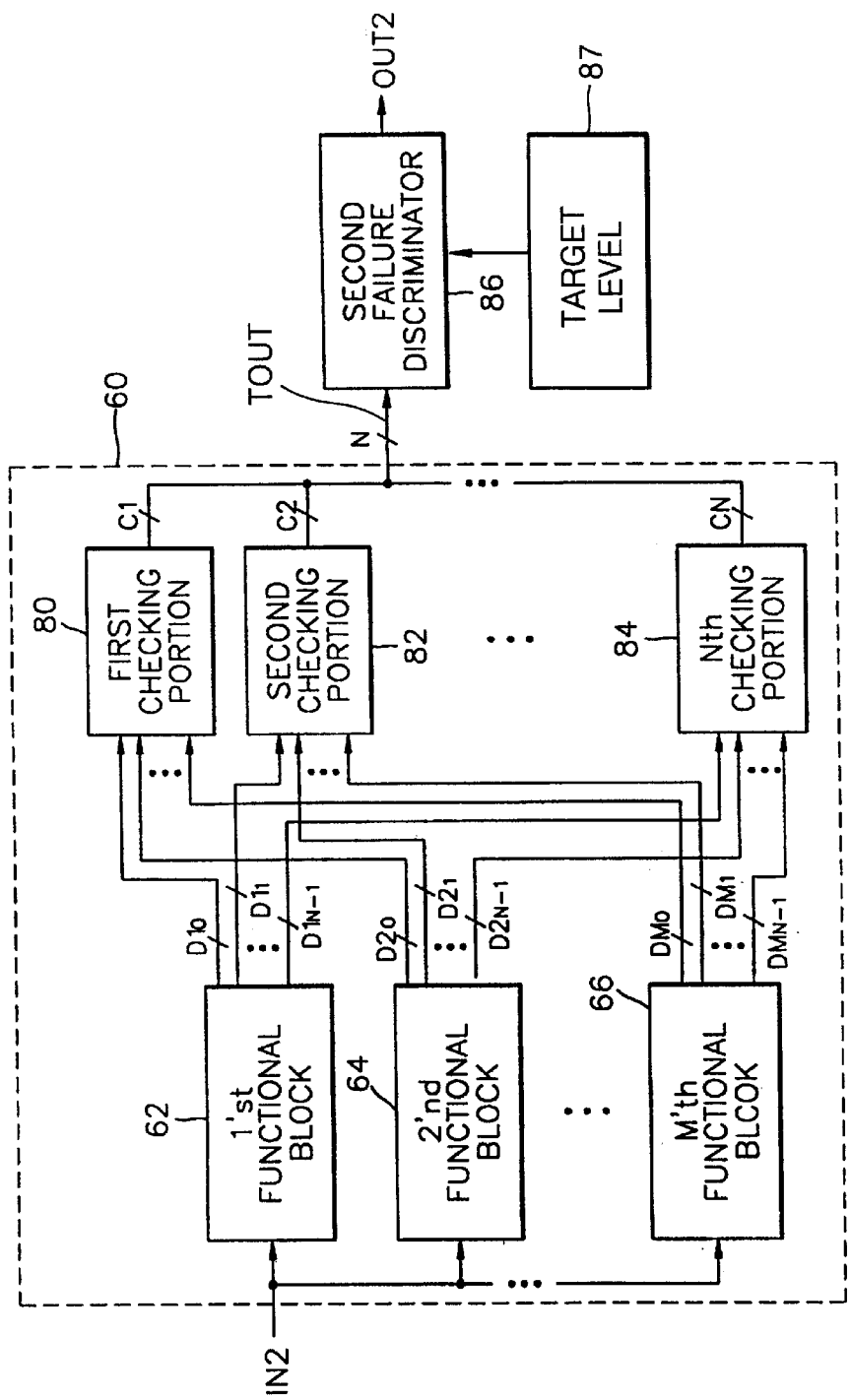
FIG. 3 is a block diagram of an apparatus for the parallel testing of a single chip according to alternative embodiment of the present invention.

FIG. 3 is a block diagram of a single chip parallel testing apparatus according to an alternative embodiment of the present invention. In this embodiment, the single chip parallel testing apparatus comprises $1^{st}$, $2^{nd}$, ... and $M^{th}$ functional blocks 62, 64, ... and 66, first, second, ... and $N^{th}$ checking portions 80, 82, ... and 84, and a second failure discriminator 86.

The $1^{st}$, $2^{nd}$, ... and $M^{th}$ functional blocks 62, 64, ... and 66 of FIG. 3 perform, for example, the same functions as those of the $1^{st}$, $2^{nd}$, ... and $M^{th}$ functional blocks 12, 14, ... and 16 of FIG. 1, and the second failure discriminator 86 performs the same function as that of the first failure discriminator 22. That is, each of the $1^{st}$, $2^{nd}$, ... and $M^{th}$ functional blocks 62, 64, ... and 66 receive a stimulus via an input port IN2 and, in general, generate the same output signals. As stated above, the functionality of each function block can be different. In this embodiment, it is assumed that each of the $1^{st}$, $2^{nd}$, ... and $M^{th}$ functional blocks 62, 64, ... and 66 outputs an N-bit signal. For example, the $1^{st}$ functional block 62 outputs N bits $D1_0$, $D1_1$, ... and $D1_{N-1}$ of an output signal to the first, second, ... and $N^{th}$ checking portions, 80, 82, 84 respectively.

Each of the first, second, ... and $N^{th}$ checking portions 80, 82, ... and 84 receives the corresponding bits from the $1^{st}$, $2^{nd}$, ... and $M^{th}$ functional blocks 62, 64, ... and 66, respectively, and determines whether the input bits have the same logic levels, and accordingly outputs an arbitrary bit among the input bits to the second failure discriminator 86, in response to the result of the determination. For example, the first checking portion 80 receives the least significant bits $D1_0$, $D2_0$, ... and $DM_0$ from the $1^{st}$, $2^{nd}$, ... and $M^{th}$ functional blocks 62, 64, ... and 66, compares whether the received bits have the same logic levels, and outputs one of the received least significant bits to the second failure discriminator 86 if the received bits have the same logic levels. Conversely, the first checking portion 80 does not output any of the least significant bits (LSB) $D1_0$, $D2_0$, ... and $DM_0$ if the logic levels of the received bits are different. As in the first failure discriminator 22 of FIG. 1, the second failure discriminator 86 determines that the single chip 60 is defective if each of the first, second, ... and $N^{th}$ checking portions 80, 82, ... and 84 does not output any LSB, or if the level of each of the LSBs output from the first, second, ... and $N^{th}$ checking portions 80, 82, ... and 84 are not equal to a predetermined target level 87.

Figure 4:
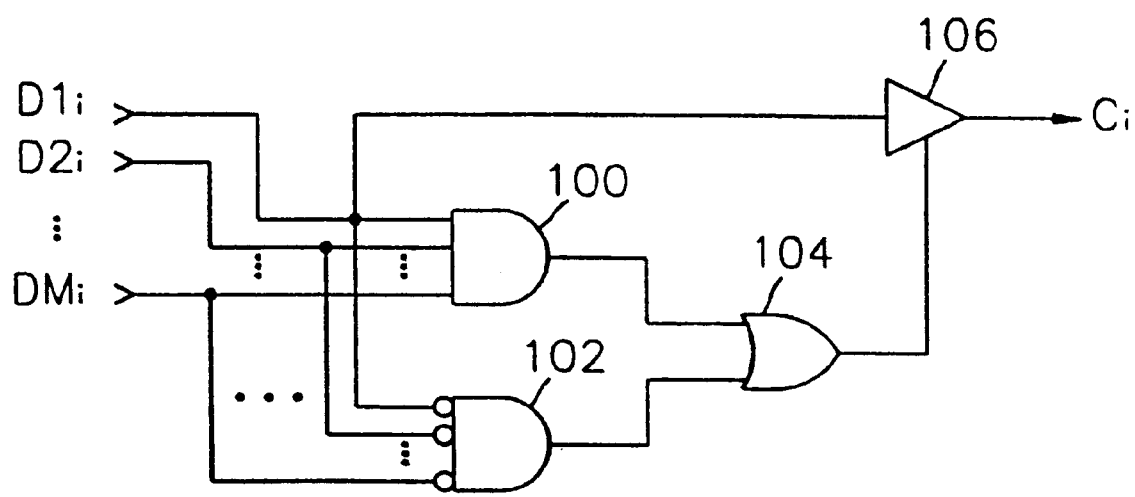
FIG. 4 is a circuit diagram of an example of the present invention of the first, second, . . . or $N^{th}$ checking portions in FIG. 3.

In the structures and operations of each checking portion 80, 82, ... or 84 according to a preferred embodiment of the present invention, each checking portion 80, 82, ... or 84 comprises AND gates 100 and 102, an OR gate 104 and a transmission gate 106 as shown in FIG. 4.

The AND gate 100 of FIG. 4 receives $i^{th}$ bits of the output signals $D1_i$, $D2_i$, ... and $DM_i$ from each of the functional blocks 62, 64, ... and 66 of FIG. 3, performs an AND operation on the input bits, and outputs the result of the AND operation to the OR gate 104. AND gate 102 receives an inverted version of the ith bits $D1_i$, $D2_i$, ... and $DM_i$, performs an AND operation on the inverted input bits, and outputs the result of the AND operation to the OR gate 104. The OR gate 104 performs an OR operation on the outputs from the AND gates 100 and 102, and outputs the result of the OR operation to the transmission gate 106. The transmission gate 106 outputs an arbitrary bit as $C_i$ to the second failure discriminator 86 in response to the output from the OR gate 104. For example, the arbitrary bit can be designated as bit $D1_i$ as shown in FIG. 4.

Figure 5:
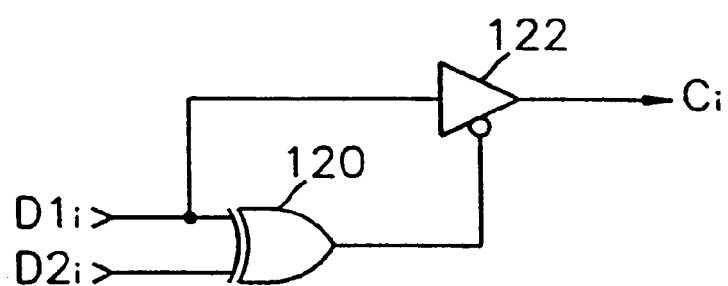
FIG. 5 is a circuit diagram of an alternative example of the present invention of the first or second checking portion shown in FIG. 3, when N=2.

When N=2, that is, when a 2-bit signal is output from each functional block, the first or second checking portion of FIG. 3 can be implemented according to another embodiment of the present invention as shown in FIG. 5. As shown in FIG. 5, the first or second checking portion comprises an XOR gate 120 and a transmission gate 122.

The XOR gate 120 of FIG. 5 performs an exclusive OR operation on the $i^{th}$ bits of the output signals $D1_i$, $D2_i$, ... and $DM_i$ from each of the functional blocks 62, 64, ... and 66 of FIG. 3, and outputs the result of the exclusive OR operation to the transfer gate 122. Here, the transmission gate 122 outputs $D1_i$ as $C_i$ in response to the logic level of the signal from the XOR gate 120. Each of the functional blocks of FIG. 1 or 3 may be a memory or digital element which satisfies the precondition that it should generate the same output with respect to the same stimulus.

As described above, in the single chip parallel testing apparatus and method according to the present invention, failure or non-failure of a single chip including a plurality of functional blocks can be tested in parallel, in real time, and at a high speed, while reducing the number of output pins.

While this invention has been particularly shown and described with references to preferred embodiments thereof, it will be understood by those skilled in the art that various changes in form and detail may be made herein without departing from the spirit and scope of the invention as defined by the appended claims.

We claim:

1. An apparatus for the parallel testing of an integrated circuit, the integrated circuit including a plurality of functional blocks, each of which, in response to a common input stimulus, generates an output signal, the apparatus comprising:
   a comparator for comparing the levels of the output signals from each of the functional blocks; and for outputting a comparison result;
   a transmitter for external transmission of one of the output signals as a transmitted output signal in response to the comparison result when the comparator determines the output signal levels to be the same, and for transmission of a defect signal when the comparator determines the output signal levels to be different; and
   a failure discriminator for comparing the transmitted output signal level to a predetermined target output signal level, and if similar, generating a positive test result signal.

2. The apparatus of claim 1 wherein the failure discriminator further generates a negative test result signal when the transmitted output signal level and the target output signal level are different.

3. The apparatus of claim 1 wherein the functional blocks comprise blocks selected from the circuit types consisting of: analog circuits; digital circuits, and memory banks.

4. The apparatus of claim 1, wherein each of the functional blocks digitally processes the stimulus to each generate an N-bit output signal, and wherein the signal output to the comparator from each functional block is an arbitrary single bit of the N-bit output signal.

5. The apparatus of claim 4 wherein the comparator comprises N-comparators, each for comparing the signal levels of like bits of the output signals.

6. A method for the parallel testing of an integrated circuit, the integrated circuit including a plurality of functional blocks, each of which, in response to a common input stimulus, generates a like output signal, comprising:
   comparing the levels of the output signals from each of the functional blocks, and outputting a comparison result;
   externally transmitting one of the output signals as a transmitted output signal in response to the comparison result when the comparator determines the output signal levels to be the same, and transmitting a defect signal when the comparator determines the output signal levels to be different; and
   comparing the transmitted output signal level to a predetermined target output signal level, and if similar, generating a positive test result signal.

7. The method of claim 6 further comprising generating a negative test result signal when the transmitted output signal level and the target output level signal are different.

8. The method of claim 6 wherein the functional blocks comprise blocks selected from the circuit types consisting of: analog circuits; digital circuits; and memory banks.

9. The method of claim 6 further comprising digitally processing the stimulus at each of the functional blocks to generate an N-bit output signal, and wherein the signal output from each functional block is an arbitrary single bit of the N-bit output signal.

10. A method for the parallel testing of an integrated circuit, the integrated circuit including a plurality of functional blocks, each of which, in response to a common input stimulus, generates a like output signal comprising the steps of:
   (a) determining whether the levels of signals output from each of the functional blocks are the same;
   (b) not transmitting any of the output signals external to the integrated circuit if the levels of all the output signals are not the same;
   (c) transmitting one of the output signals external to the integrated circuit if the levels of all output signals from each of the functional blocks are the same;
   (d) determining whether the level of the transmitted output signal is the same as a predetermined target output signal level;
   (e) determining the integrated circuit to be non-defective if the level of the output signal is substantially the same as the target level; and
   (f) determining the integrated circuit to be substantially defective if all output signals are not the same in step (b), or if the level of the transmitted output signal is not the same as the target level.

11. An apparatus for the parallel testing of an integrated circuit, the integrated circuit including a plurality of functional blocks, each of which, in response to a common input stimulus, digitally processes the stimulus to each generate an N-bit output signal, the apparatus comprising:

a comparator for comparing the levels of the output signals from each of the functional blocks, each output signal comprising an arbitrary single bit of the N-bit output signal, and for outputting a comparison result;

a transmitter for external transmission of one of the output signals as a transmitted output signal in response to the comparison result; and a failure discriminator for comparing the transmitted output signal level to a predetermined target output signal level, and if similar, generating a positive test result signal.

12. The apparatus of claim 11 wherein the failure discriminator further generates a negative test result signal when the transmitted output signal level and the target output signal level are different.

13. The apparatus of claim 11 wherein the transmitter transmits one of the output signals when the comparator determines the output signal levels to be the same, and transmits a defect signal when the comparator determines the output signal levels to be different.

14. The apparatus of claim 11 wherein the functional blocks comprise blocks selected from the circuit types consisting of: analog circuits; digital circuits, and memory banks.

15. The apparatus of claim 11 wherein the comparator comprises N-comparators, each for comparing the signal levels of like bits of the output signals.

16. A method for the parallel testing of an integrated circuit, the integrated circuit including a plurality of functional blocks, each of which digitally processes a common input stimulus to generate a like N-bit output signal, comprising:

comparing the levels of the output signals from each of the functional blocks, each output signal comprising an arbitrary single bit of the N-bit output signal, and outputting a comparison result;

externally transmitting one of the output signals as a transmitted output signal in response to the comparison result; and comparing the transmitted output signal level to a predetermined target output signal level, and if similar, generating a positive test result signal.

17. The method of claim 16 further comprising generating a negative test result signal when the transmitted output signal level and the target output level signal are different.

18. The method of claim 16 wherein the step of externally transmitting further comprises transmitting one of the output signals when the comparator determines the output signal levels to be the same, and transmitting a defect signal when the comparator determines the output signal levels to be different.

19. The method of claim 16 wherein the functional blocks comprise blocks selected from the circuit types consisting of: analog circuits; digital circuits; and memory banks.

* * * * *